United States Patent [19]
Forbes et al.

[11] Patent Number: 6,165,836
[45] Date of Patent: *Dec. 26, 2000

[54] CIRCUIT AND METHOD FOR AN OPEN BIT LINE MEMORY CELL WITH A VERTICAL TRANSISTOR AND TRENCH PLATE TRENCH CAPACITOR

[75] Inventors: Leonard Forbes, Corvallis, Oreg.; Wendell P. Noble, Milton, Vt.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/138,794

[22] Filed: Aug. 24, 1998

Related U.S. Application Data

[62] Division of application No. 08/939,732, Oct. 6, 1997, Pat. No. 5,907,170.

[51] Int. Cl.[7] ............................................. H01L 21/8242
[52] U.S. Cl. ............................................. 438/243; 438/587
[58] Field of Search .................................. 438/243, 244, 438/246, 247, 248, 386, 387, 389, 587, 588

[56] References Cited

U.S. PATENT DOCUMENTS

| | | | |
|---|---|---|---|
| 4,020,364 | 4/1977 | Kuijk | 307/242 |
| 4,051,354 | 9/1977 | Choate | 235/312 |
| 4,313,106 | 1/1982 | Hsu | 340/825.91 |
| 4,604,162 | 8/1986 | Sobczak | 156/657 |
| 4,617,649 | 10/1986 | Kyomasu et al. | 365/189 |
| 4,663,831 | 5/1987 | Birrittella et al. | 29/576 E |
| 4,673,962 | 6/1987 | Chatterjee et al. | 357/23.6 |
| 4,701,423 | 10/1987 | Szluk | 437/57 |
| 4,716,314 | 12/1987 | Mulder et al. | 307/477 |
| 4,761,768 | 8/1988 | Turner et al. | 365/201 |
| 4,766,569 | 8/1988 | Turner et al. | 365/185 |
| 4,845,537 | 7/1989 | Nishimura et al. | 357/23.4 |
| 4,888,735 | 12/1989 | Lee et al. | 365/185 |
| 4,920,065 | 4/1990 | Chin et al. | 437/52 |
| 4,920,515 | 4/1990 | Obata | 365/189.08 |
| 4,949,138 | 8/1990 | Nishimura | 357/23.6 |
| 4,965,651 | 10/1990 | Wagner | 357/42 |
| 4,987,089 | 1/1991 | Roberts | 437/34 |
| 5,001,526 | 3/1991 | Gotou | 357/23.6 |
| 5,010,386 | 4/1991 | Groover, III | 357/42 |
| 5,017,504 | 5/1991 | Nishimura et al. | 437/40 |
| 5,021,355 | 6/1991 | Dhong et al. | 437/35 |
| 5,028,977 | 7/1991 | Kenneth et al. | 357/43 |

(List continued on next page.)

OTHER PUBLICATIONS

Adler, E., et al., "The Evolution of IBM CMOS DRAM Technology", *IBM Journal of Research and Development*, 39, 167–188, (Jan./Mar., 1995).

Asai, S., et al., "Technology Challenges for Integration Near and Below 0.1 micrometer", *Proceedings of the IEEE*, 85, Special Issue on Nanometer–Scale Science & Technology, 505–520, (Apr. 1997).

(List continued on next page.)

*Primary Examiner*—Chandra Chaudhari
*Attorney, Agent, or Firm*—Schwegman, Lundberg, Woessner & Kluth, P.A.

[57] ABSTRACT

A memory cell. The memory cell includes an access transistor. The access transistor is formed in a pillar of single crystal semiconductor material. The transistor has first and second source/drain regions and a body region that are vertically aligned. The memory cell also includes a body contact that is coupled to the body region. A gate of the transistor is disposed on a side of the pillar that is opposite from the body contact. A trench capacitor is also included. The trench capacitor includes a first plate that is formed integral with the first source/drain region of the access transistor and a second plate that is disposed adjacent to the first plate and separated from the first plate by a gate oxide. An insulator layer that separates the access transistor and the trench capacitor from an underlying layer of semiconductor material.

4 Claims, 18 Drawing Sheets

U.S. PATENT DOCUMENTS

| | | | |
|---|---|---|---|
| 5,057,896 | 10/1991 | Gotou | 257/296 |
| 5,072,269 | 12/1991 | Hieda | 257/302 |
| 5,083,047 | 1/1992 | Horie et al. | 307/465 |
| 5,087,581 | 2/1992 | Rodder | 437/41 |
| 5,102,817 | 4/1992 | Chatterjee et al. | 437/47 |
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,221,867 | 6/1993 | Mitra et al. | 307/465 |
| 5,223,081 | 6/1993 | Doan | 156/628 |
| 5,226,514 | 7/1993 | Tuan et al. | 437/52 |
| 5,308,782 | 5/1994 | Mazure et al. | 437/52 |
| 5,316,962 | 5/1994 | Matsuo et al. | 438/245 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,416,350 | 5/1995 | Watanabe | 257/330 |
| 5,416,736 | 5/1995 | Kosa et al. | 365/174 |
| 5,422,296 | 6/1995 | Lage | 437/52 |
| 5,422,499 | 6/1995 | Manning | 257/67 |
| 5,427,972 | 6/1995 | Shimizu et al. | 437/52 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,528,062 | 6/1996 | Hsieh et al. | 257/298 |
| 5,574,299 | 11/1996 | Kim | 257/296 |
| 5,576,238 | 11/1996 | Fu | 437/52 |
| 5,581,101 | 12/1996 | Ning et al. | 257/347 |
| 5,593,912 | 1/1997 | Rajeevakumar | 437/52 |
| 5,616,934 | 4/1997 | Dennison et al. | 257/67 |
| 5,627,097 | 5/1997 | Venkatesan et al. | 438/217 |
| 5,637,898 | 6/1997 | Baliga | 257/330 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,674,769 | 10/1997 | Alsmeier et al. | 438/243 |
| 5,691,230 | 11/1997 | Forbes | 437/62 |
| 5,753,947 | 5/1998 | Gonzalez | 257/296 |
| 5,818,084 | 10/1998 | Williams et al. | 257/329 |
| 5,821,578 | 10/1998 | Shimoji | 257/295 |
| 5,827,765 | 10/1998 | Stengl et al. | 438/243 |
| 5,864,158 | 1/1999 | Liu et al. | 257/330 |
| 5,907,170 | 5/1999 | Forbes et al. | 257/296 |
| 5,909,400 | 6/1999 | Bertin et al. | 365/187 |
| 5,909,618 | 6/1999 | Forbes et al. | 438/242 |
| 5,914,511 | 6/1999 | Noble et al. | 257/302 |
| 5,917,342 | 6/1999 | Okamura | 326/103 |
| 5,920,088 | 7/1999 | Augusto | 257/192 |
| 5,926,412 | 7/1999 | Evans, Jr. et al. | 365/145 |
| 5,936,274 | 8/1999 | Forbes et al. | 257/315 |
| 5,946,472 | 8/1999 | Graves et al. | 395/500 |
| 5,963,469 | 10/1999 | Forbes | 365/149 |
| 5,973,352 | 10/1999 | Noble | 257/315 |
| 5,973,356 | 10/1999 | Noble et al. | 257/319 |
| 6,006,166 | 12/1999 | Meyer | 702/119 |

OTHER PUBLICATIONS

Banerjee, S.K., et al., "Characterization of Trench Transistors for 3–D Memories", *1986 Symposium on VLSI Technology, Digest of Technical Papers*, San Diego, CA, 79–80, (May 28–30, 1986).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method for Low–Voltage CMOS Digital Cicuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21 (Sep. 30–Oct. 3, 1996).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: Analysis and Design of Digital Integrated Circuits, 2nd Edition, McGraw–Hill Book Co., New York, 354–357, (1988).

Holman, W.T., et al., "A Compact Low Noise Operational Amplifier for a 1.2 Micrometer Digital CMOS Technology", IEEE Journal of Solid–State Circuits, 30, 710–714, (Jun. 1995).

Hu, G., et al., "Will Flash Memory Replace Hard Disk Drive?", 1994 IEEE International Electron Device Meeting, Panel Discussion, Session 24, Outline, 1 p., (Dec. 13, 1994).

Huang, W.L., et al., "TFSOI Complementary BiCMOS Technology for Low Power Applications", IEEE Transactions on Electron Devices, 42, 506–512, (Mar. 1995).

Jun, Y.K., et al., "The Fabrication and Electrical Properties of Modulated Stacked Capacitor for Advanced DRAM Applications", IEEE Electron Device Letters, 13, 430–432, (Aug. 1992).

Jung, T.S., et al., "A 117–mm2 3.3–V Only 128–Mb Multilevel NAND Flash Memory for Mass Storage Applications", IEEE Journal of Solid–State Circuits, 31, 1575–1582, (Nov. 1996).

Kang, H.K., et al., "Highly Manufacturable Process Technology for Reliable 256 Mbit and 1Gbit DRAMs", IEEE International Electron Devices Meeting, Technical Digest, San Francisco, CA, 635–638, (Dec. 11–14, 1994).

Kim, Y.S., et al., "A Study on Pyrolysis DMEAA for Selective Deposition of Aluminum", In: Advanced Metallization and Interconnect Systems for ULSI Applications in 1995, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dymanic Random Access Memories (DRAMs)", Japanese Journal of Applied Physics, 34, 6899–6902, (Dec. 1995).

Kohyama, Y., et al., "Buried Bit–Line Cell for 64MB DRAMs", 1990 Symposium on VLSI Technology, Digest of Technical Papers, Honolulu, HI, 17–18, (Jun. 4–7, 1990).

Koshida, N., et al., "Efficient Visible Photoluminescence from Porous Silicon", Japanese Journal of Applied Physics, 30, L1221–L1223, (Jul. 1991).

Kuge, S., et al., "SOI–DRAM Circuit Technologies for Low Power High Speed Multigiga Scale Memories", IEEE Journal of Solid–State Circuits, 31, 586–591, (Apr. 1996).

Lantz, II, L., "Soft Errors Induced By Alpha Particles", IEEE Transactions on Reliability, 45, 174–179, (Jun. 1996).

Lehmann, V., "The Physics of Macropore Formation in Low Doped n–Type Silicon", J. Electrochem. Soc., 140, 2836–2843, (Oct. 1993).

Lu, N., et al., "The SPT Cell—A New Substrate–Plate Trench Cell for DRAMs", 1985 IEEE International Electron Devices Meeting, Technical Digest, Washington, D.C., 771–772, (Dec. 1–4, 1985).

MacSweeney, D., et al., "Modelling of Lateral Bipolar Devices in a CMOS Process", IEEE Bipolar Circuits and Technology Meeting, Minneapolis, MN, 27–30, (Sep. 1996).

Maeda, S., et al., "A Vertical Phi–Shape Transistor (VPhiT) Cell for 1 Gbit DRAM and Beyond", 1994 Symposium of VLSI Technology, Digest of Technical Papers, Honolulu, HI, 133–134, (Jun. 7–9, 1994).

Maeda, S., et al., "Impact of a Vertical Phi–Shape Transistor (VPhiT) Cell for 1 Gbit DRAM and Beyond", IEEE Transactions of Electron Devices, 42, 2117–2123, (Dec. 1995).

Malaviya, S., IBM TBD, 15, p. 42, (Jul. 1972).

Nitayama, A., et al., "High Speed and Compact CMOS Circuits with Multipillar Surrounding Gate Transistors", IEEE Transactions of Electron Devices, 36, 2605–2606, (Nov. 1989).

Ohno, Y., et al., "Estimation of the Charge Collection for the Soft–Error Immunity by the 3D–Device Simulation and the Quantitative Investigation", Simulation of Semiconductor Devices and Processes, 6, 302–305, (Sep. 1995).

Oowaki, Y., et al., "New alpha–Particle Induced Soft Error Mechanism in a Three Dimensional Capacitor Cell", IEICE Transactions on Electronics, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", IEICE Transactions on Electronics, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", 1991 IEEE International Electron Devices Meeting, Washington, D.C., 469–472, (Dec. 8–11, 1991).

Parke, S.A., et al., "A High–Performance Lateral Bipolar Transistor Fabricated on SIMOX", IEEE Electron Device Letters, 14, 33–35, (Jan. 1993).

Pein, H., et al., "A 3–D Sidewall Flash EPROM Cell and Memory Array", IEEE Transactions on Electron Devices, 40, 2126–2127, (Nov. 1993).

Pein, H., et al., "Performance of the 3–D PENCIL Flash EPROM Cell and Memory Array", IEEE Transactions on Electron Devices, 42, 1982–1991, (Nov., 1995).

Pein, H.B., et al., "Performance of the 3–D Sidewall Flash EPROM Cell", IEEE International Electron Devices Meeting, Technical Digest, 11–14, (1993).

Rao, K.V., et al., "Trench Capacitor Design Issues in VLSI DRAM Cells", 1986 IEEE International Electron Devices Meeting, Technical Digest, Los Angeles, CA, 140–143, (Dec. 7–10, 1986).

Richardson, W.F., et al., "A Trench Transistor Cross–Point DRAM Cell", IEEE International Electron Devices Meeting, Washington, D.C., 714–717, (Dec. 1–4, 1985).

Sagara, K., et al., "A 0.72 micro–meter2 Recessed STC (RSTC) Technology for 256Mbit DRAMs using Quarter–Micron Phase–Shift Lithography", 1992 Symposium on VLSI Technology, Digest of Technical Papers, Seattle, WA, 10–11, (Jun. 2–4, 1992).

Saito, M., et al., "Technique for Controlling Effective Vth in Multi–Gbit DRAM Sense Amplifier", 1966 Symposium on VLSI Circuits, Digest of Technical Papers, Honolulu, HI, 106–107, (Jun. 13–15, 1996).

Shah, A.H., et al., "A 4–Mbit DRAM with Trench–Transistor Cell", IEEE Journal of Solid–State Circuits, SC–21, 618–625, (Oct. 1986).

Shah, A.H., et al., "A 4Mb DRAM with Cross–Point Trench Transistor Cell", 1986 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", IEEE Electron Device Letters, 16, 100–102, (Mar. 1995).

Shimomura, K., et al., "A 1V 46ns 16Mb SOI–DRAM with Body Control Technique", 1997 IEEE International Solid–State Circuits Conference, Digest of Technical Papers, 68–69, (Feb. 6, 1997).

Stellwag, T.B., et al., "A Vertically–Integrated GaAs Bipolar DRAM Cell", IEEE Transactions on Electron Devices, 38, 2704–2705, (Dec. 1991).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sun, J., "CMOS Technology for 1.8V and Beyond", *Int'l Symp. on VLSI Technology, Systems and Applications: Digest of Technical Papers*, 293–297, (1997).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takao, Y., et al., "A 4–um(2) Full–CMOS SRAM Cell Technology for 0.2–um High Performance Logic LSIs", *1997 Symp. on VLSI Technology: Digest of Technical Papers*, Kyoto, Japan, 11–12, (1997).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications",*IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices 38*, 2487–2496, (Nov. 1991).

Wang, N., *Digital MOS Integrated Circuits*, Prentice Hall, Inc. , Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density Dram's" *IEEE Journal of Solid–State Circuits*, 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

CIRCUIT AND METHOD FOR AN OPEN BIT LINE MEMORY CELL WITH A VERTICAL TRANSISTOR AND TRENCH PLATE TRENCH CAPACITOR

This application is a divisional of U.S. Ser. No. 08/939,732 now U.S. Pat. No. 5,907,170 filed Oct. 6, 1997.

TECHNICAL FIELD OF THE INVENTION

The present invention relates generally to the field of memory devices and, in particular, to a circuit and method for an open bit line memory cell with a vertical transistor and trench plate trench capacitor

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

A memory array is typically implemented as an integrated circuit on a semiconductor substrate in one of a number of conventional layouts. One such layout is referred to as an "open digit line" architecture. In this architecture, the array is divided into at least two separate parts or "sub-arrays." Each sub-array includes a number of rows and columns of memory cells. Each memory cell in a row is coupled to a common word line and each transistor in a column is coupled to a common bit line. Each bit line in the first sub-array is paired with a bit line in the second sub-array so as to feed into a common sense amplifier. The sense amplifier detects and amplifies differences in voltage on a pair of bit lines as described in more detail below.

To read data out of a cell, the capacitor of a cell is accessed by selecting the word line associated with the cell. A complementary bit line that is paired with the bit line for the selected cell is equilibrated with the voltage on the bit line for the selected cell. The equilibration voltage is typically midway between the high and low logic levels. Thus, conventionally, the bit lines are equilibrated to one-half of the power supply voltage, $V_{CC}/2$. When the word line is activated for the selected cell, the capacitor of the selected cell discharges the stored voltage onto the bit line, thus changing the voltage on the bit line.

The sense amplifier detects and amplifies the difference in voltage on the pair of bit lines. The sense amplifier typically includes two main components: an n-sense amplifier and a p-sense amplifier. The n-sense amplifier includes a cross-coupled pair of n-channel transistors that drive the low bit line to ground. The p-sense amplifier includes a cross-coupled pair of p-channel transistors and is used to drive the high bit line to the power supply voltage.

An input/output device for the array, typically an n-channel transistor, passes the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Each of the components of a memory device are conventionally formed as part of an integrated circuit on a "chip" or wafer of semiconductor material. One of the limiting factors in increasing the capacity of a memory device is the amount of surface area of chip used to form each memory cell. In the industry terminology, the surface area required for a memory cell is characterized in terms of the minimum feature size, "F," that is obtainable by the lithography technology used to form the memory cell. Conventionally, the memory cell is laid out with a transistor that includes first and second source/drain regions separated by a body or gate region that are disposed horizontally along a surface of the chip. When isolation between adjacent transistors is considered, the surface area required for such a transistor is generally $8F^2$ or $6F^2$.

Some researchers have proposed using a vertical transistor in the memory cell in order to reduce the surface area of the chip required for the cell. Each of these proposed memory cells, although smaller in size from conventional cells, fails to provide adequate operational characteristics when compared to more conventional structures. For example, U.S. Pat. No. 4,673,962 (the '962 Patent) issued to Texas Instruments on Jun. 16, 1997. The '962 Patent discloses the use of a thin poly-silicon field effect transistor (FET) in a memory cell. The poly-silicon FET is formed along a sidewall of a trench which runs vertically into a substrate. At a minimum, the poly-silicon FET includes a junction between poly-silicon channel (58) and the bit line (20) as shown in FIG. 3 of the '962 Patent. Unfortunately, this junction is prone to charge leakage and thus the poly-silicon FET may have inadequate operational qualities to control the charge on the storage capacitor. Other known disadvantages of such thin film poly-silicon devices may also hamper the operation of the proposed cell.

Other researchers have proposed use of a "surrounding gate transistor" in which a gate or word line completely surrounds a vertical transistor. See, e.g., Impact of a Vertical Φ-shape transistor (VΦT) Cell for 1 Gbit DRAM and Beyond, IEEE Trans. On Elec. Devices, Vol 42, No.12, December, 1995, pp. 2117–2123. Unfortunately, these devices suffer from problems with access speed due to high gate capacitance caused by the increased surface area of the gate which slows down the rise time of the word lines. Other vertical transistor cells include a contact between the pass transistor and a poly-silicon plate in the trench. Such vertical transistor cells are difficult to implement due to the contact and should produce a low yield.

For the reasons stated above, and for other reasons stated below which will become apparent to those skilled in the art upon reading and understanding the present specification, there is a need in the art for realizable memory cell that uses less surface area than conventional memory cells.

SUMMARY OF THE INVENTION

The above mentioned problems with memory cells and other problems are addressed by the present invention and which will be understood by reading and studying the following specification. A memory cell is described which includes a vertical transistor with a trench plate trench capacitor and a body contact.

In particular, one embodiment of the present invention provides a memory cell. The memory cell includes an access transistor. The access transistor is formed in a pillar of single crystal semiconductor material. The transistor has first and second source/drain regions and a body region that are vertically aligned. The memory cell also includes a body contact that is coupled to the body region. A gate of the transistor is disposed on a side of the pillar that is opposite from the body contact. A trench capacitor is also included. The trench capacitor includes a first plate that is formed integral with the first source/drain region of the access transistor and a second plate that is disposed adjacent to the first plate and separated from the first plate by a gate oxide. An insulator layer separates the access transistor and the trench capacitor from an underlying layer of semiconductor material.

In another embodiment, a memory device is provided. The memory device includes an array of memory cells. Each cell includes a vertical access transistor formed of a semiconductor pillar that extends outwardly from an insulator layer on a substrate. The access transistor has body and first and second source/drain regions, a gate disposed adjacent to a side of the pillar adjacent to the body region, and a trench capacitor. The first plate of the trench capacitor is integral with the first source/drain region and a second plate of the capacitor is disposed adjacent to the first plate. A number of bit lines are each selectively coupled to a number of the memory cells at the second source/drain region of the access transistor so as to form columns of memory cells. A number of word lines are also provided. Each word line is disposed orthogonally to the bit lines in a trench between rows of the memory cells for addressing gates of the access transistors of the memory cells that are adjacent to the word line. A number of body lines is also provided. Each body line is disposed in a trench between rows of memory cells so as to contact the body regions of access transistors on a side of the trench opposite the word line in the trench. Further the memory device includes a row decoder that is coupled to the word lines and body lines and a column decoder that is coupled to the bit lines so as to selectively access the cells of the array.

In another embodiment, a memory array is provided. The memory array includes an array of memory cells. Each memory cell includes an access transistor. The access transistor has body and first and second source/drain regions that are vertically formed outwardly from an insulator layer on a substrate in a single crystalline semiconductor pillar and a gate that is disposed adjacent to a side of the transistor. The second source/drain region includes an upper semiconductor surface. A number of word lines are included that interconnect gates of selected access transistors so as to form a number of rows of memory cells. A number of body address lines also interconnect body regions of selected access transistors in the rows of memory cells. A number of first isolation trenches separate adjacent rows of memory cells. Each isolation trench houses a word line and a body address line. A number of second isolation trenches are also provided. Each second isolation trench is substantially orthogonal to the first isolation trenches and interposed between adjacent memory cells so as to form a number of columns of the array.

In another embodiment, a method of fabricating a memory array is provided. A number of access transistors are formed. Each access transistor is formed in a pillar of semiconductor material that extends outwardly from a substrate. The access transistor includes a first source/drain region, a body region and a second source/drain region formed vertically thereupon. A trench capacitor for each access transistor is also formed. A first plate of the trench capacitor is integral with the first source/drain region of the access transistor. A number of word lines interconnect the gates of a number of access transistors to form a row of the array. The word lines are disposed in a number of trenches that separate adjacent rows of access transistors. A number of body address lines that interconnect body regions of access transistors along the rows of the array are also formed. A number of bit lines that interconnect second source/drain regions of selected access transistors are formed so as to form a number of columns of the array.

DETAILED DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and logical, mechanical and electrical changes may be made without departing from the scope of the present invention. The following detailed description is, therefore, not to be taken in; a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
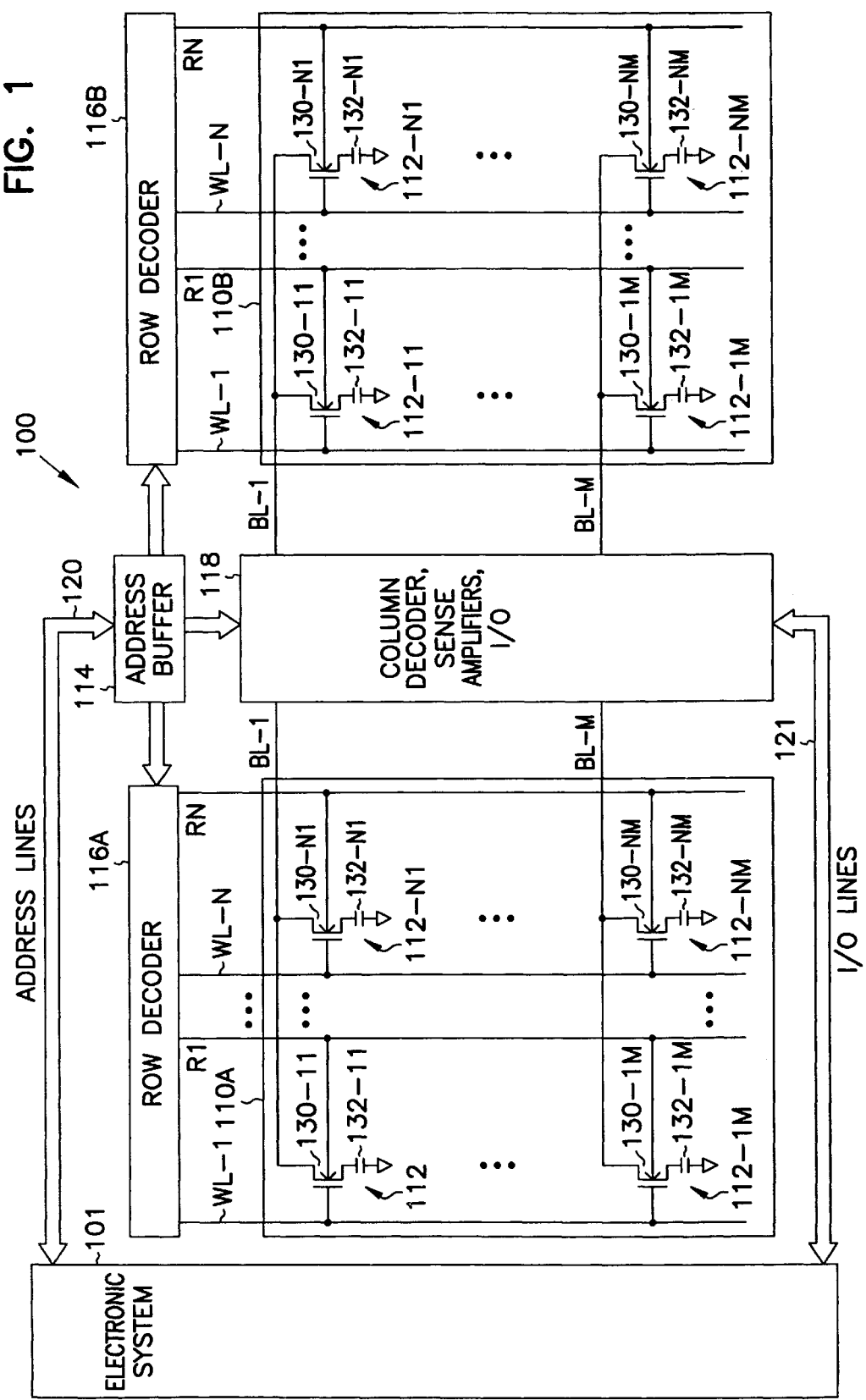
FIG. 1 is a block/schematic diagram of an illustrative embodiment of the present invention that includes a memory device that is coupled to an electronic system.

FIG. 1 is a block/schematic diagram that illustrates generally one embodiment of a memory device 100 incorporating an array of memory cells constructed according to the teachings of the present invention. Memory device 100 is coupled to electronic system 101. Electronic system 101 may comprise, for example, a microprocessor, a memory controller, a chip set or other appropriate electronic system. Memory device 100 illustrates, by way of example but not by way of limitation, a dynamic random access memory (DRAM), in an open bit line configuration. Memory device 100 includes memory arrays 110A and 110B. Each array includes N rows and M columns of memory cells 112-ij, where i refers to the row of the cell and j refers to the column of the cell.

In the exemplary embodiment of FIG. 1, each of memory cells 112-ij has a substantially identical structure, and accordingly, only one memory cell is described herein. These memory cells 112-ij include a vertical transistor where one plate of a capacitor is integral with the transistor. Memory cell 112-11 includes vertical transistor 130-11. A source/drain region of transistor 130-11 is formed in a deep trench and extends to a sufficient depth to form a storage node of storage capacitor 132-11. The other terminal of storage capacitor 132-11 is part of a mesh or grid of poly-silicon that surrounds the source/drain region of transistor 130-11 and is coupled to ground potential.

Each of the N rows of memory cells includes one of word lines WL-1 through WL-N that is formed in a trench separating adjacent rows of memory cells 112-ij. Portions of word lines WL-1 through WL-N adjacent to transistors 130-ij act as gate regions for the respective transistors. Each of the M columns includes one of bit lines BL-1 through BL-M.

Bit lines BL-1 through BL-M are used to write to and read data from memory cells 112-ij. Word lines WL-1 through WL-N are used to access a particular row of memory cells 112-ij that is to be written or read. Addressing circuitry is also included. For example, address buffer 114 is coupled to control column decoder 118, which also includes sense amplifiers and input/output circuitry that is coupled to bit lines BL-1 through BL-M of arrays 110A and 110B. Address buffer 114 also is coupled to control row decoders 116A and 116B. Row decoders 116A and B and column decoder 118 selectably access memory cells 112-ij in response to address signals that are provided on address lines 120 from electronic system 101 during write and read operations.

Memory 100 also includes body address line R-1 through R-N. As illustrated, the body address lines are coupled to word line decoder 116 so as to selectively control the potential applied to the body of the vertical transistors. The body address line and the word address line can be driven with in a synchronous body address technique in which the body is driven slightly positive when the cell is addressed and slightly negative when not addressed. Advantageously, this provides more overdrive when the cell is addressed and less leakage when the cell is in standby. This also reduces the requirements on threshold voltage control of the access transistor. Any threshold voltage without body bias around zero volts is sufficient.

In operation, memory 100 receives an address of a particular memory cell at address buffer 114. For example, electronic system 101 may provide address buffer 114 with the address for cell 112-11 of array 110A. Address buffer 114 identifies word line WL-1 for memory cell 112-11 to row decoder 116A. Row decoder 116A selectively activates word line WL-1 to activate access transistor 130-1j of each memory cell 112-1j that is connected to word line WL-1. Column decoder 118 selects bit lines BL-1 for memory cell 112-11. For a write operation, data received by input/output circuitry is coupled to bit lines BL-1 and through the access transistor 130-11 to charge or discharge storage capacitor 132-11 of memory cell 112-11 to represent binary data. For a read operation, bit line BL-1 of array 110A is equilibrated with bit line BL-1 of array 110B. Data stored in memory cell 112-11, as represented by the charge on its storage capacitor 132-11, is coupled to bit line BL-1 of array 110A. The difference in charge in bit lines BL-1 of array 110A and bit line BL-1 of array 110B is amplified, and a corresponding voltage level is provided to the input/output circuits. Body address lines are driven according to the synchronous technique described above.

Figure 2:
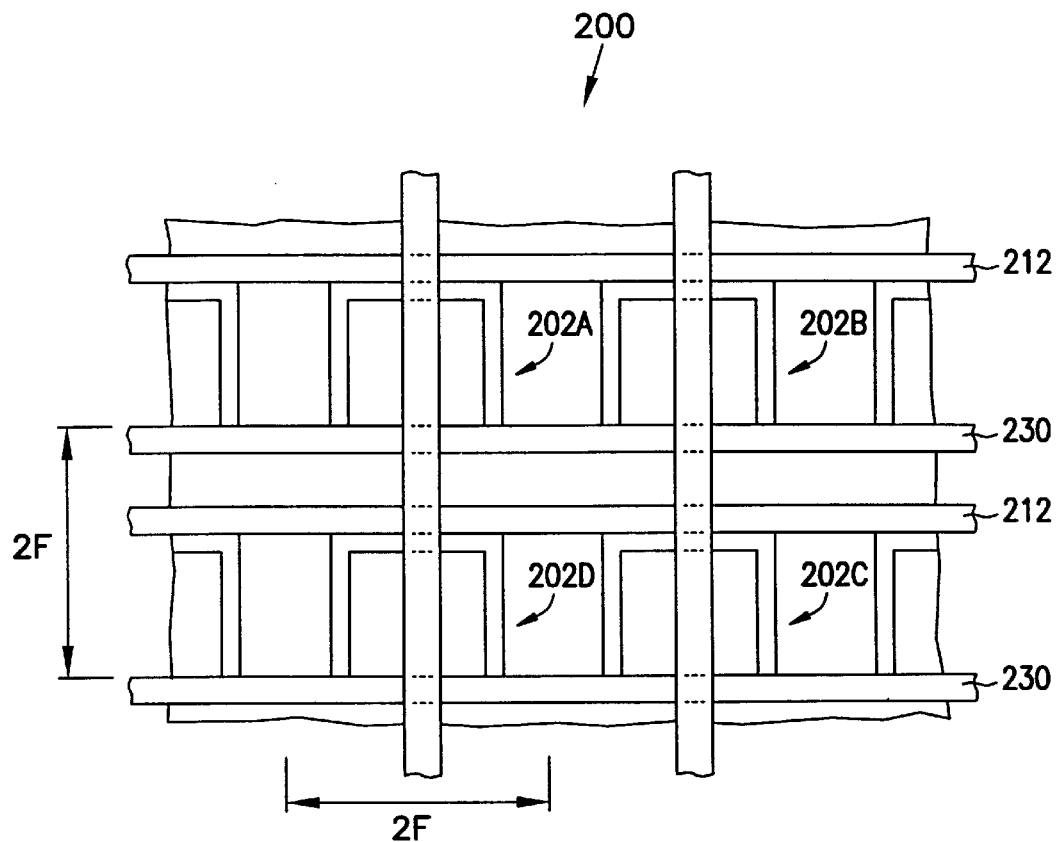
FIG. 2 is a plan view of an illustrative embodiment of a layout for a memory array according to the teachings of the present invention.
Figure 3:
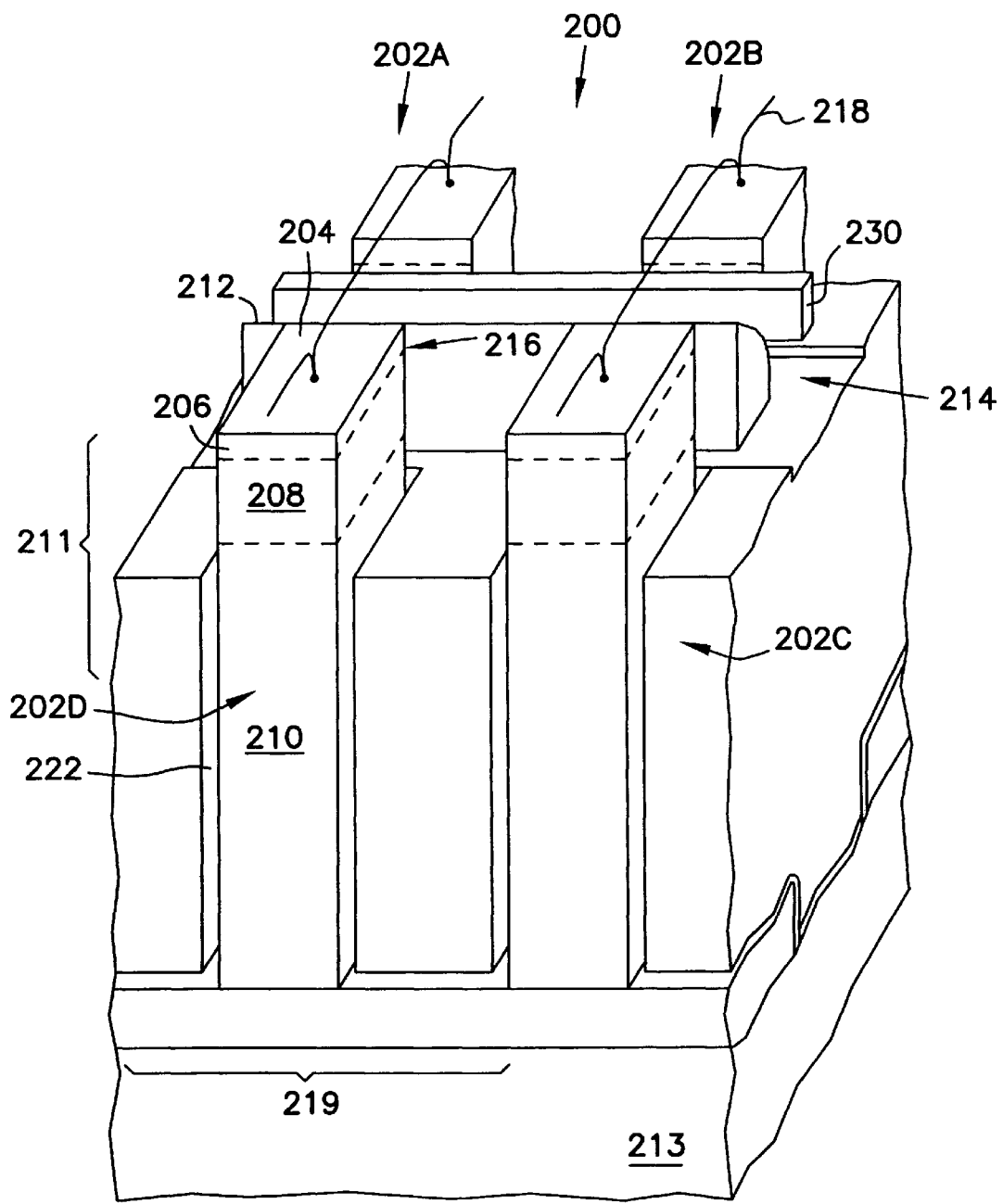
FIG. 3 is a perspective view of the illustrative embodiment of FIG. 2.
Figure 4:
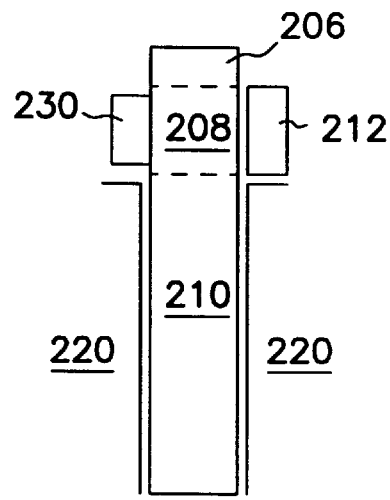
FIG. 4 is an elevational view of an illustrative embodiment of a memory cell with a body contact according to the teachings of the present invention.

FIGS. 2 through 4 illustrate an embodiment of a memory cell with a vertical transistor and trench capacitor for use, for example, in memory device 100 of FIG. 1. Specifically, FIG. 2 is a plan view of a layout of a number of memory cells indicated generally at 202A through 202D in array 200. FIG. 2 depicts only four memory cells. It is understood, however, that array 200 may include a larger number of memory cells even though only four are depicted here.

Each memory cell is constructed in a similar manner. Thus, only memory cell 202D in FIG. 3 is described herein in detail. Memory cell 202D includes pillar 204 of single crystal semiconductor material, e.g., silicon that is divided into first source/drain region 206, body region 208, and second source/drain region 210 to form access transistor 211. Pillar 204 extends vertically outward from substrate 213, for example, p− silicon. First source/drain region 206 and second source/drain region 210 each comprise, for example, n+ silicon and body region 208 comprises p− silicon.

Word line 212 passes body region 208 of access transistor 211 in isolation trench 214. Word line 212 is separated from body region 208 of access transistor 204 by gate oxide 216 such that the portion of word line 212 adjacent to body region 208 operates as a gate for access transistor 211. Word line 212 may comprise, for example, n+ poly-silicon material that is deposited in isolation trench 214 using a technique such that word line 212 is less than a minimum feature size, F, for the lithographic technique used to fabricate array 200. Cell 202D is coupled in a column with cell 202A by bit line 218.

Memory cell 202D also includes storage capacitor 219 for storing data in the cell. A first plate of capacitor 219 for memory cell 202D is integral with second source/drain region 210 of access transistor 211. Thus, memory cell 202D may be more easily realizable when compared to conventional vertical transistors since there is no need for a contact between second source/drain region 210 and capacitor 219. Second plate 220 of capacitor 219 is common to all of the capacitors of array 200. Second plate 220 comprises a mesh or grid of n+ poly-silicon formed in deep trenches that surrounds at least a portion of second source/drain region 210 of each pillar 204A through 204D. Second plate 220 is grounded by contact with substrate 213 underneath the trenches. Second plate 220 is separated from source/drain region 210 by gate oxide 222.

The access transistors of memory array 200 are also coupled to body address lines. For example, FIG. 2 depicts body address line 230 that is coupled to cells 202A and 202B. FIG. 4 also illustrates that the body address line for a particular memory cell is located on a side opposite the word line for the cell.

As shown in FIG. 2, the memory cells of array 200 are four-square feature ($4F^2$) memory cells. Using cell 202D as an example, the surface area of cell 202D is calculated based on linear dimensions in the bit line and word line directions. In the bit line direction, the distance from one edge of cell 202D to a common edge of adjacent cell 202A is approximately 2 minimum feature sizes (2F). In the word line direction, the dimension is taken from the midpoint of isolation trenches on either side of memory cell 202D. Again, this is approximately two minimum feature sizes (2F). Thus, the size of the cell is $4F^2$. This size is much smaller than the current cells with stacked capacitors or trench capacitors.

Figure 5A:
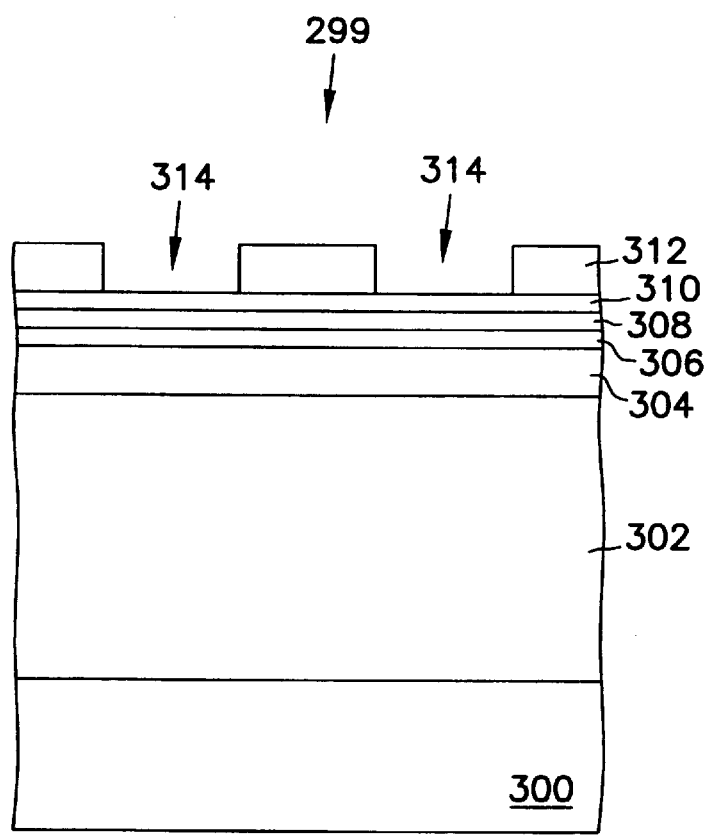
FIGS. 5A through 5O are perspective and elevational views of an embodiment of an integrated circuit that illustrate processing steps for fabricating the integrated circuit according to the teachings of the present invention.

FIGS. 5A through 5O illustrate one embodiment of a process for fabricating an array of memory cells, indicated generally at 299, according to the teachings of the present invention. In this example, dimensions are given that are appropriate to a 0.2 micrometer lithographic image size. For other image sizes, the horizontal and vertical dimensions can be scaled accordingly.

As shown in FIG. 5A, the method begins with substrate 300. Substrate 300 comprises, for example, a P-type silicon wafer, layer of P− silicon material, or other appropriate substrate material. Layer 302 is formed, for example, by epitaxial growth outwardly from layer 300. Layer 302 comprises single crystalline N+ silicon that is approximately 3.5 micrometers thick. Layer 304 is formed outwardly from layer 302 by epitaxial growth of single crystalline P− silicon of approximately 0.5 microns. Layer 306 is formed by ion implantation of donor dopant into layer 304 such that layer 306 comprises single crystalline N+ silicon with a depth of approximately 0.1 microns.

A thin layer of silicon dioxide ($SiO_2$), referred to as pad oxide 308, is deposited or grown on layer 306. Pad oxide 308 has a thickness of approximately 10 nanometers. A layer of silicon nitride ($Si_3N_4$), referred to as pad nitride 310, is deposited on pad oxide 308. Pad nitride 310 has a thickness of approximately 200 nanometers.

Figure 5B:
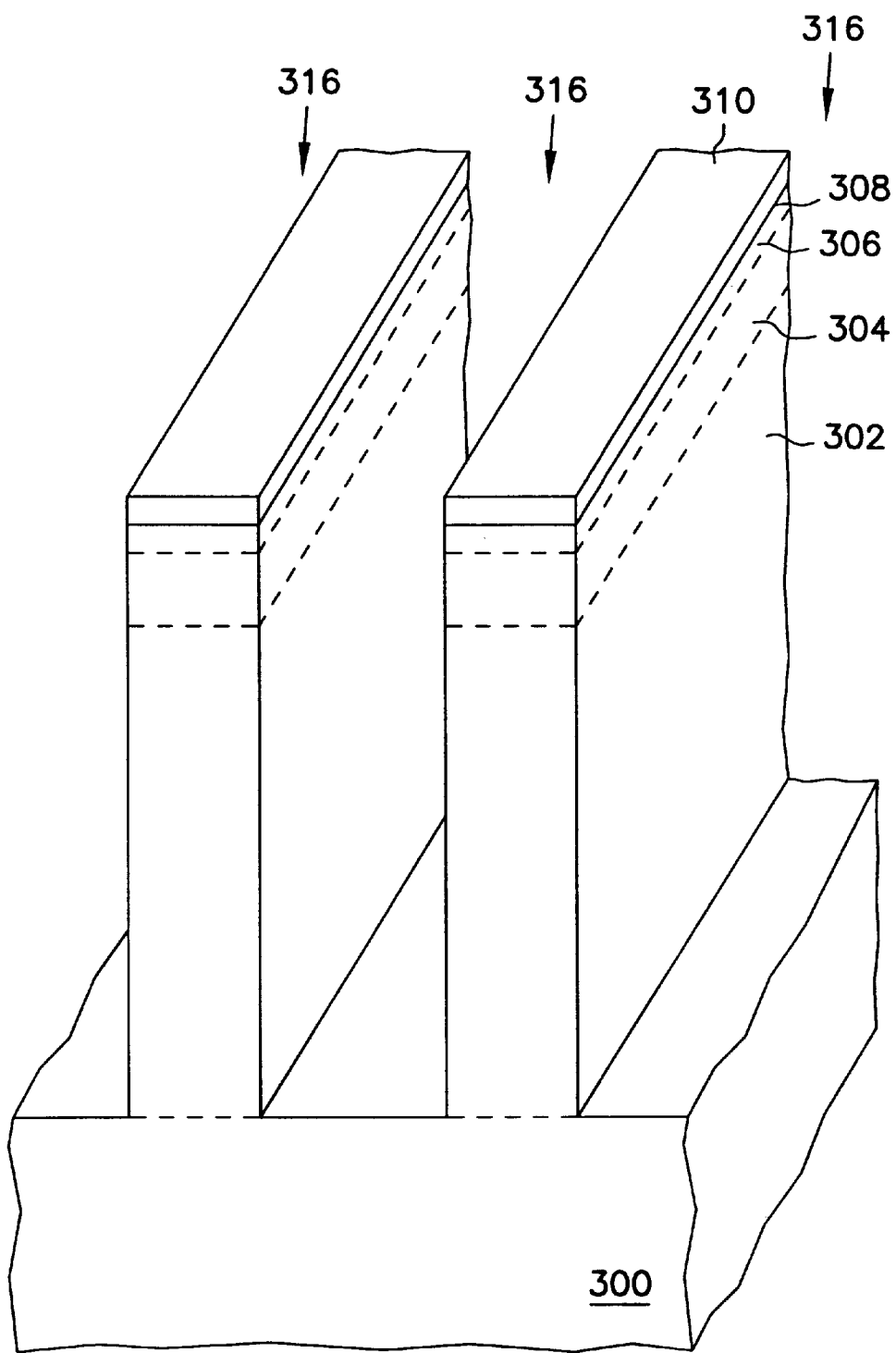

Photo resist layer 312 is deposited outwardly from layer 310. Photo resist layer 312 is patterned with a mask to define openings 314 in layer 312 to be used in selective etching. As shown in FIG. 5B, column isolation trenches 316 are etched through openings 314 in photo resist layer 312 in a direction parallel to which the bit lines will be formed. Column isolation trenches 316 extend down through nitride layer 310, oxide layer 308, N+ layer 306, P− layer 304, N+ layer 302, and into substrate 300.

A thin thermal protective oxide layer 318 is grown on exposed surfaces of substrate 300 and layers 302, 304, and 306. Layer 318 is used to protect substrate 300 and layers 302, 304 and 306 during subsequent process step.

Figure 5C:
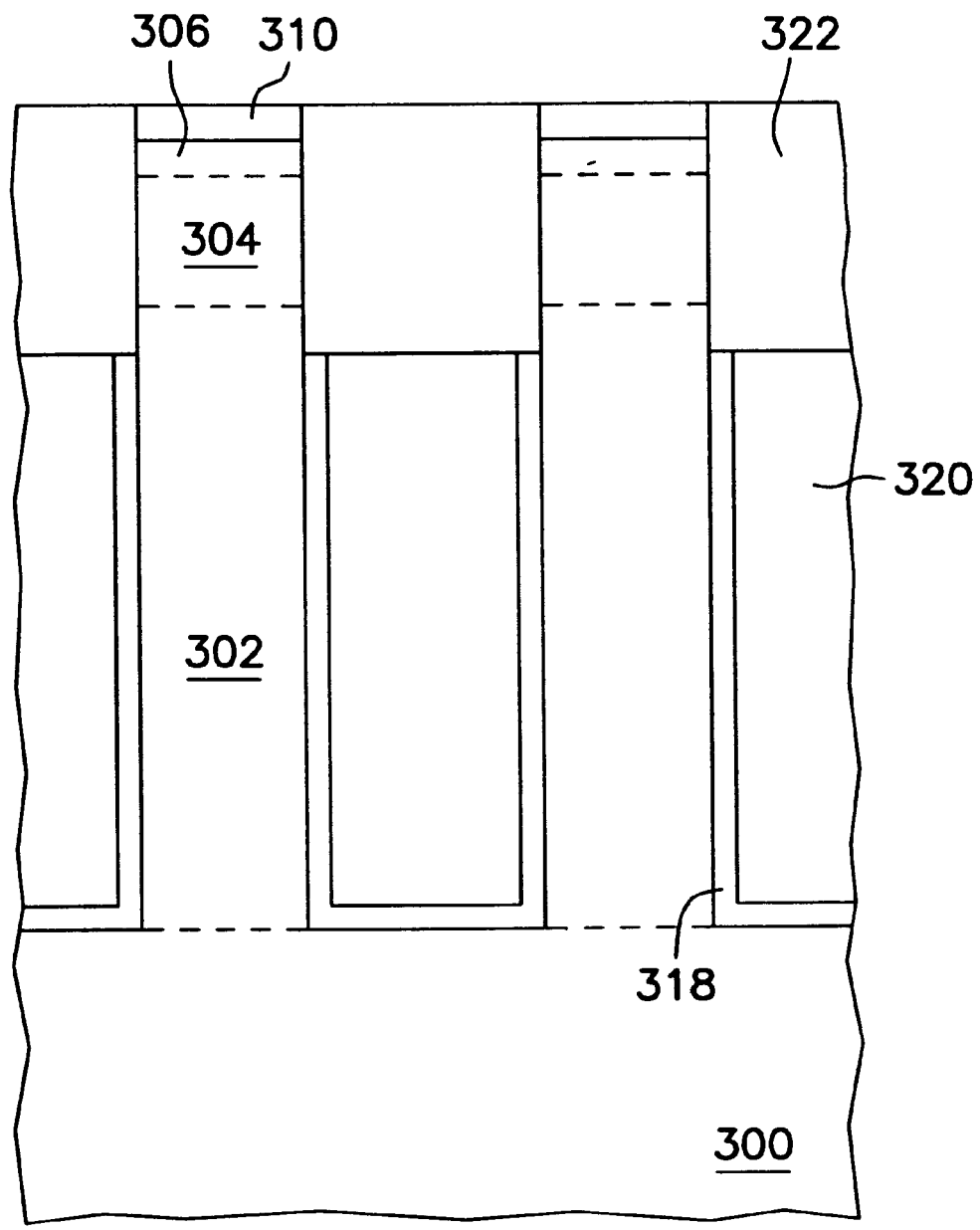

A layer of intrinsic poly-silicon 320 is deposited by chemical vapor deposition (CVD) to fill column isolation trenches 316. Layer 320 is etched by reactive ion etching (RIE) such that layer 320 is recessed below a top of layer 302. Layer 322 of silicon nitride ($Si_3N_4$) is deposited by, for example, chemical vapor deposition to fill trenches 316. Layer 322 is planarized back to a level of layer 310 using, for example, chemical mechanical polishing (CMP) or other suitable planarization technique to produce the structure shown in FIG. 5C.

Figure 5D:
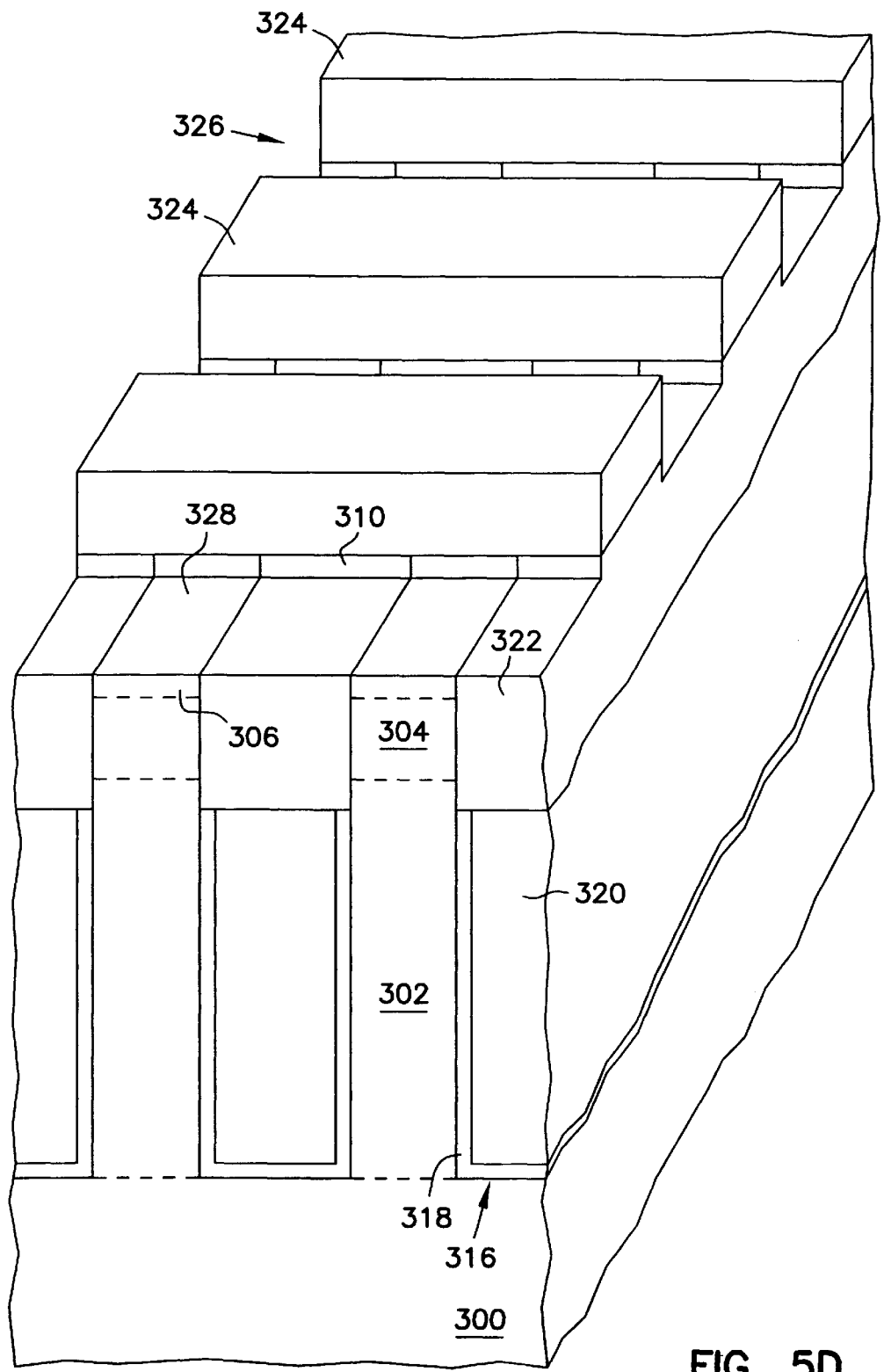

As shown in FIG. 5D, layer 324 of photo resist material is deposited outwardly from nitride layers 322 and 310. Layer 324 is exposed through a mask to define openings 326 in layer 324. Openings 326 are orthogonal to trenches 316 that were filled by intrinsic poly-silicon layer 320 and nitride layer 322. Next, nitride layers 310 and 322 are etched to a depth sufficient to expose a working surface 328 of layer 306. It is noted that at this point layer 320 of intrinsic poly-silicon is still covered by a portion of nitride layer 322.

Figure 5E:
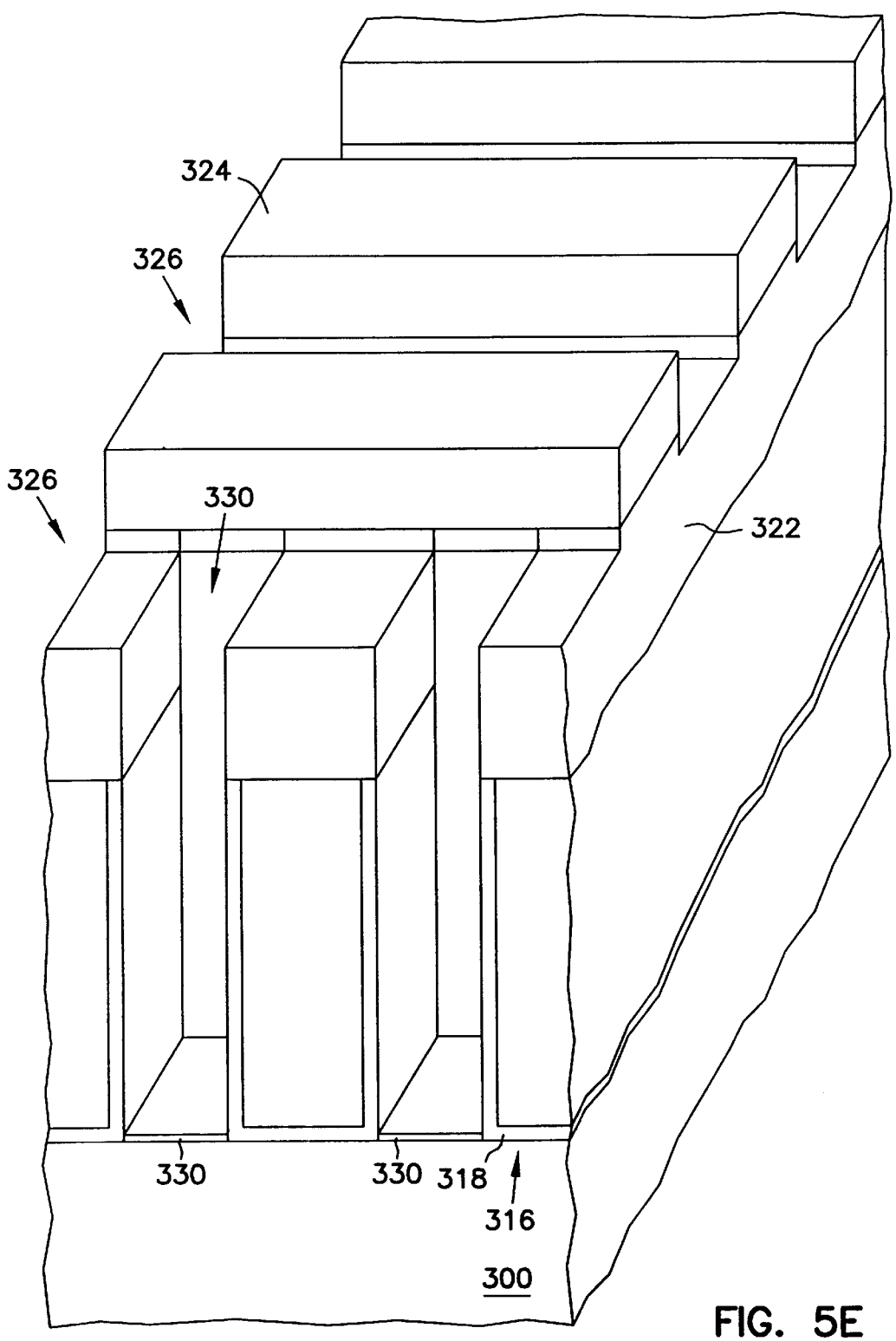

As shown in FIG. 5E, the portion of layers 306, 304, and 302 that are exposed in openings 326 are selectively etched down to a distance approximately equal to column isolation trenches 316.

Figure 5F:
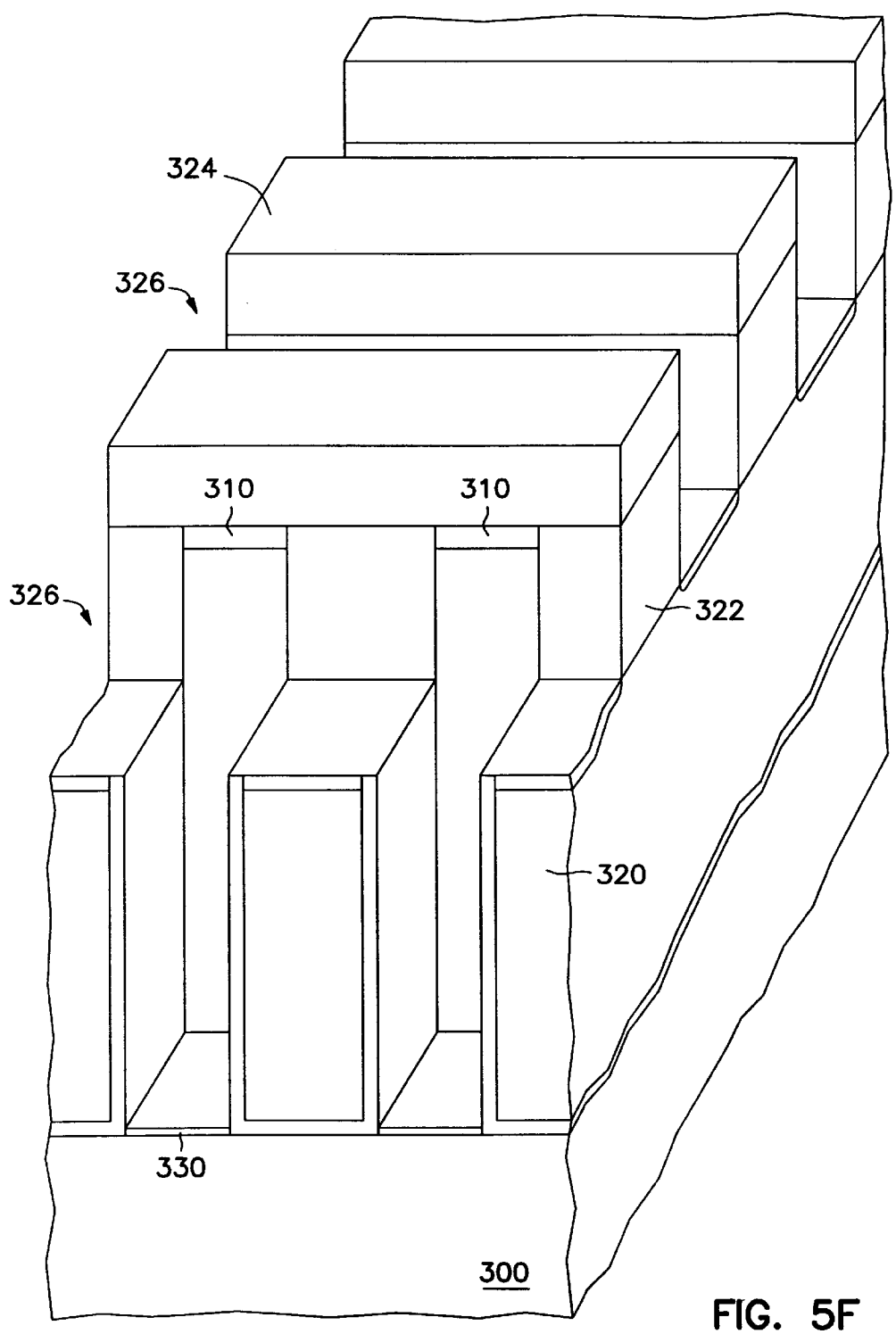
Figure 5G:
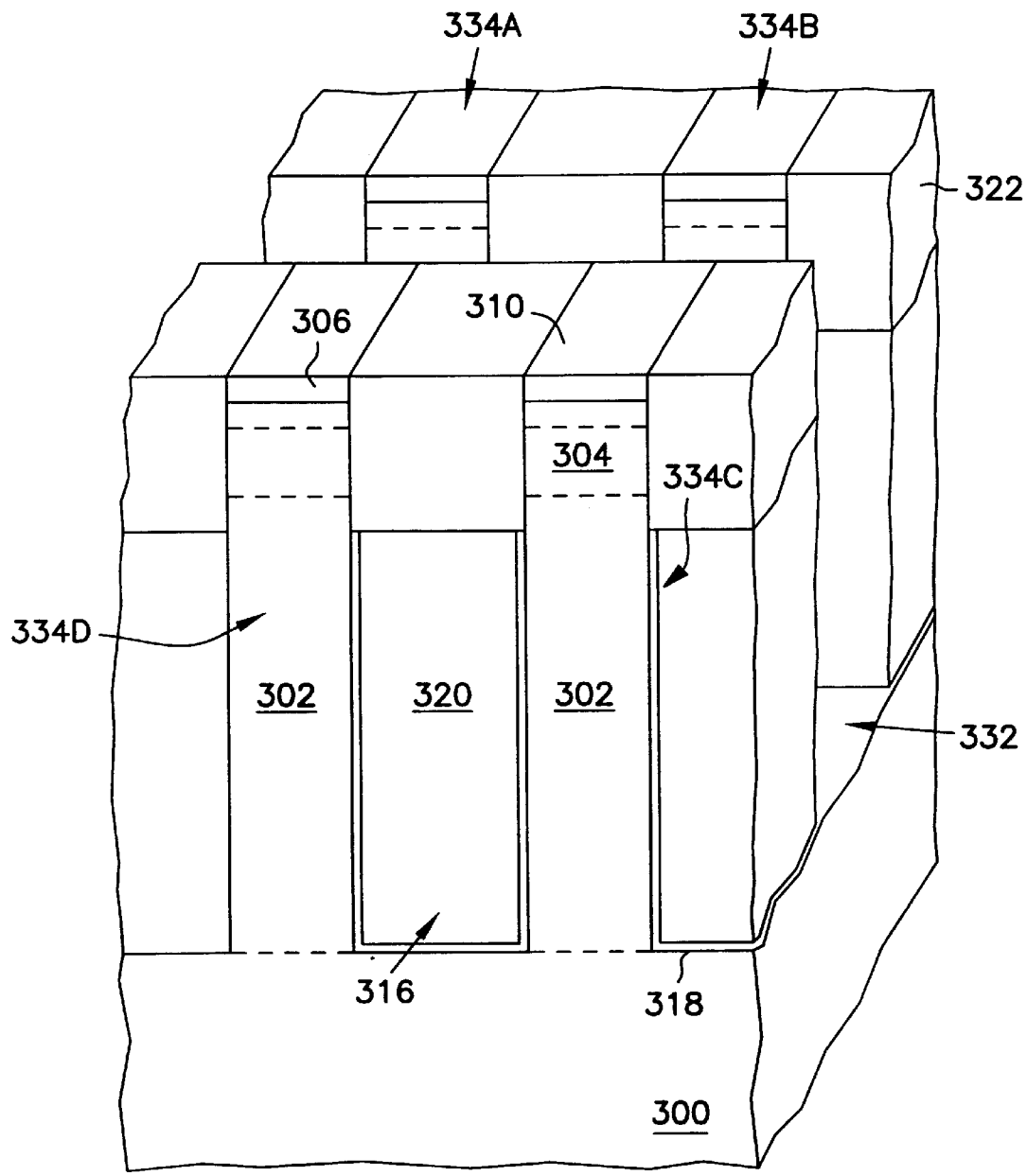

As shown in FIG. 5F, the remaining nitride layer 322 exposed in openings 326 is directionally etched to expose layer of intrinsic poly-silicon 320. It is noted that nitride layer 322 and nitride layer 310 remain intact under the photo resist layer 324. Layer 324 is removed. Thermal oxide layer 330 is formed by, for example, growing a 20 nanometer layer of oxide on exposed silicon and intrinsic poly-silicon in openings 326. Intrinsic poly-silicon is deposited through openings 326 to refill the trenches. The intrinsic poly-silicon in openings 326 is directionally etched, selective to nitride. A brief oxide etch is used to clear oxide layer 330 from intrinsic poly-silicon 320. The intrinsic poly-silicon in openings 326 is etched to the same depth as trenches 316 so as to form row isolation trenches 332. The structure is now as shown in FIG. 5G.

Nitride is deposited by chemical vapor deposition in trenches 332 to a thickness of approximately 20 nanometers. The nitride is directionally etched to leave on the vertical sidewalls of trenches 332. Next, an isotropic oxide etch is used to remove all exposed thin oxide, clearing oxide from the bottom of trenches 332.

Figure 5H:
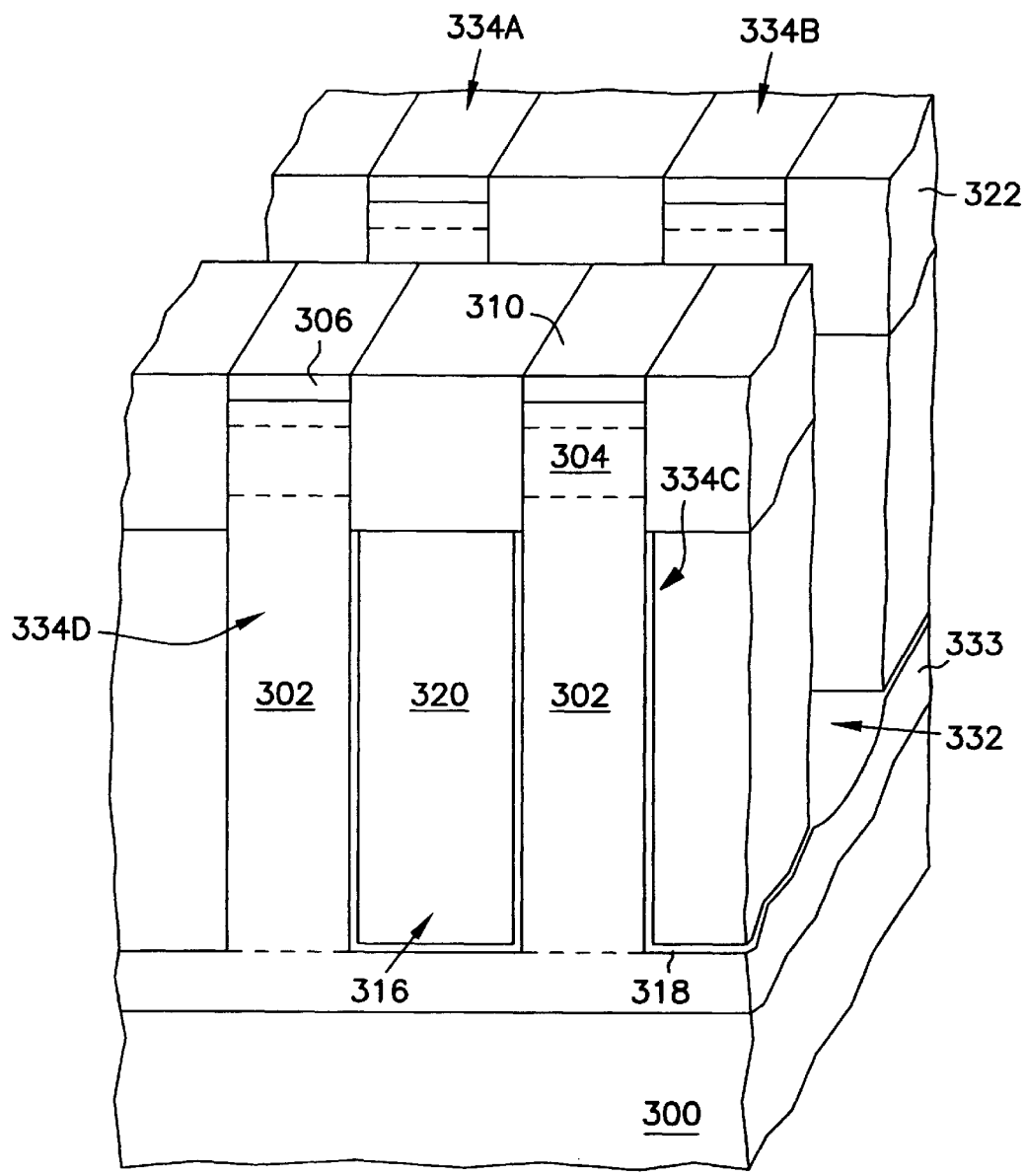

Thermal oxide layer 333 is formed beneath single crystal silicon pillars 334A through 334D. This is accomplished by first doing an isotropic silicon etch that etches both single crystal and intrinsic poly-silicon downward and laterally to completely undercut pillars 334A through 334D. Although completely undercut, pillars 334A through 334D are supported by contact with original crystal at the ends. Next, thermal oxide layer 333 is grown with a thickness of approximately 0.1 micrometers (for 0.2 micrometer CD) beneath pillars 334A through 334D. The nitride is removed from the sidewalls of trenches 332 to expose the remaining intrinsic poly-silicon of layer 320. It is noted that pillars 334A through 334D are still covered with protective oxide 330. At this point the structure is as shown in FIG. 5H.

Figure 5I:
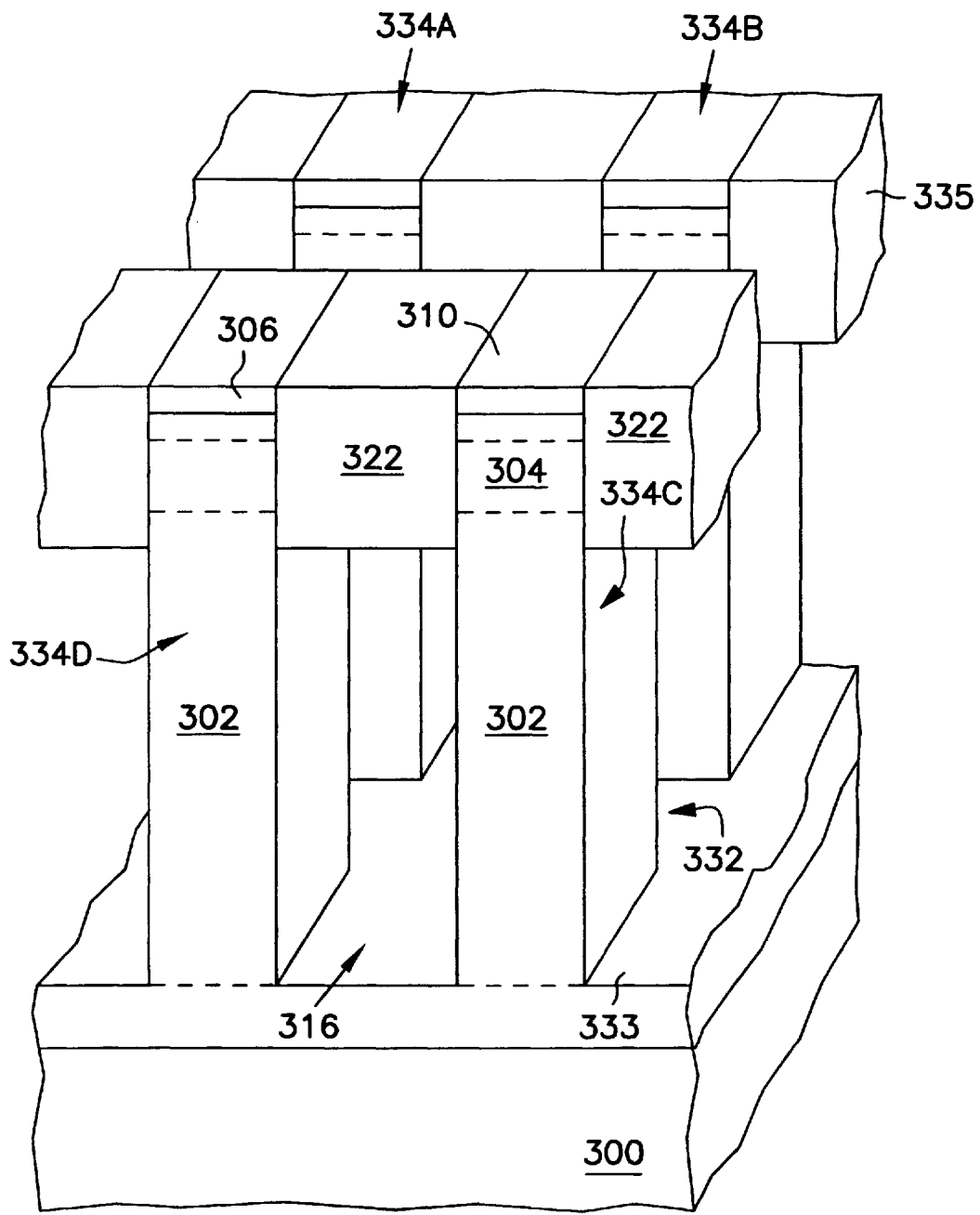

The remaining portions of intrinsic poly-silicon are removed by an isotropic etch. Further, all exposed thin thermal oxide is removed from the walls of pillars 334A through 334D with an isotropic etch leaving the structure shown in FIG. 5I. This structure includes nitride bridges 335 formed from nitride layers 310 and 322 that extend orthogonal to column isolation trenches 316 and cover the remaining portions of layers 302, 304, and 306. The structure also includes row isolation trenches 332 that are orthogonal to column isolation trenches 316. The structure of FIG. 5I also includes pillars 334A through 334D of single crystal silicon material. Pillars 334A through 334D form the basis for individual memory cells for the memory array formed by the process.

Conductor mesh or grid 340 is formed in trenches 332 and 316. Exposed oxide layer 333 in trenches 332 is directionally etched down to expose underlying layer 300 in trenches 332. A refractory metal, e.g., Ti, W, is deposited by collimated deposition onto the exposed surface of layer 300 to form metal contact 331.

Figure 5J:
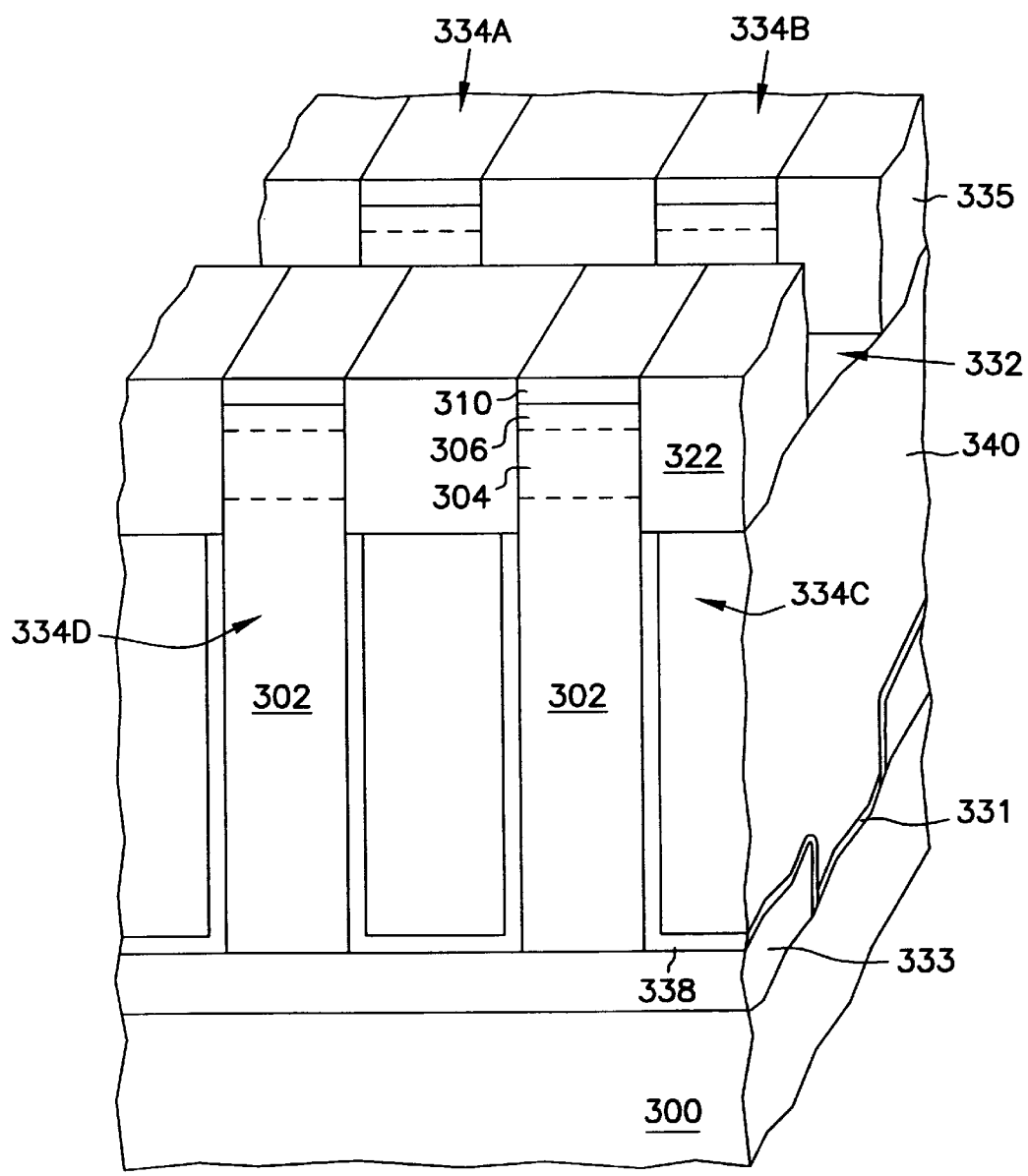

Next, insulator layer 338 is formed by depositing an insulator material in trenches 316 and 332. Layer 338 is used as the insulator layer for the storage capacitors in array 299. In embodiments involving metal contact 331, layer 338 is directionally etched to remove layer 338 from the bottom of trenches 332 to expose metal contact 331. A common plate for all of the memory cells of array 299 is formed by a chemical vapor deposition of N+ poly-silicon or other appropriate refractory conductor in column isolation trenches 316 and row isolation trenches 332. In this manner, conductor mesh or grid 340 is formed so as to surround each of pillars 334A through 334D. Mesh 340 is planarized and etched back to a level approximately at the bottom of bridges 335 as shown in FIG. 5J. An additional etch is performed to remove any remaining exposed insulator material of layer 338 from the sides of semiconductor pillars 334A through 334D above mesh 340.

Nitride is deposited by, for example, chemical vapor deposition into channels 332 to a thickness of approximately 20 nanometers. The nitride is directionally etched to leave on sidewalls 350 of pillars 334A through 334D. Thermal oxide cap 352 is formed by, for example, growing a layer of oxide on exposed portions of poly-silicon mesh 340 in trenches 332. The nitride is stripped from sidewalls 350 of pillars 334A through 334D.

Figure 5K:
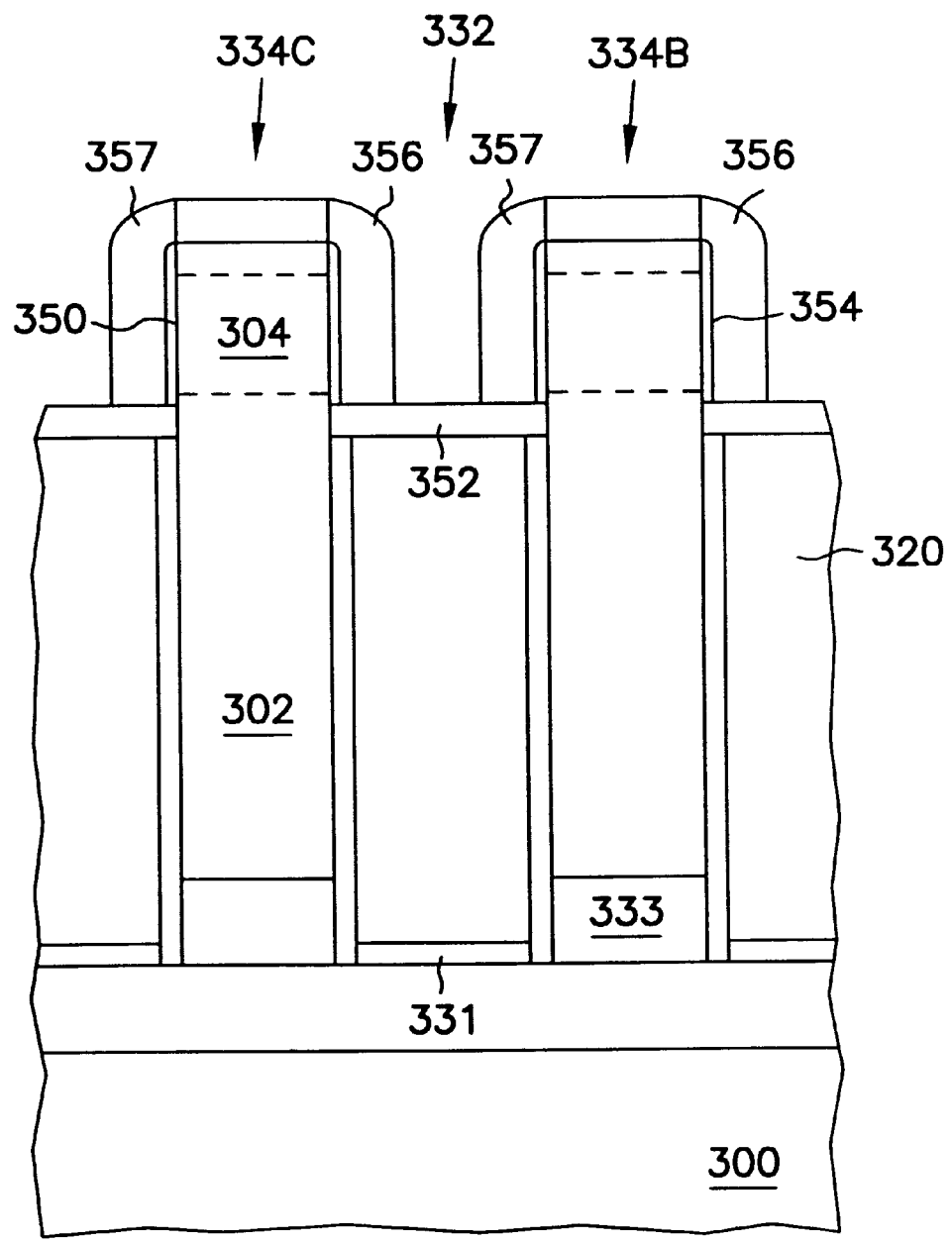

As shown in FIG. 5K, gate oxide 354 is formed on surface 350 of pillars 334A through 334D. A layer of n+ poly-silicon is deposited in trenches 332 to a thickness of approximately one-third of the critical dimension of the processing technique. The n+ poly-silicon is directionally etched to leave as word lines 356 on one side of pillars 334A through 334D. On the opposite side of pillars 334A through 334D, the n+ poly-silicon forms spacers that will be replaced with body contacts in subsequent processing steps. It is noted that the portions of word lines 356 that are disposed adjacent to pillars 334A through 334D act as gates for the access transistors of array 299.

Figure 5L:
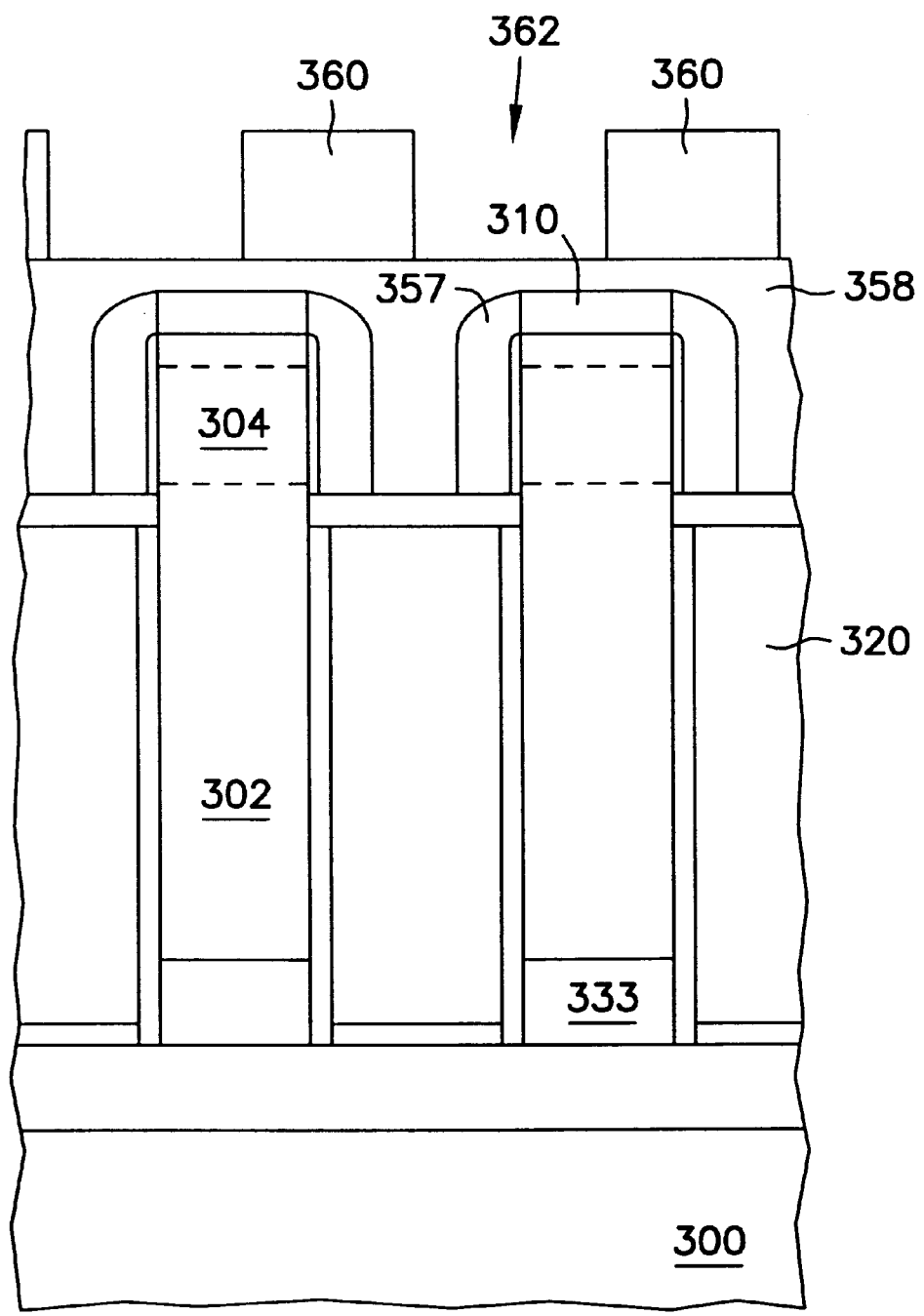

As shown in FIG. 5L, nitride layer 358 is formed by, for example, chemical vapor deposition of nitride so as to fill trenches 358 and cover array 299. Nitride layer 358 is planarized, e.g., using a chemical/mechanical polishing technique. Photo resist layer is deposited and exposed through a mask to define stripes in layer 360 that expose approximately half of each trench 332 that contains spacers 357. This leaves the structure as shown in FIG. 5L.

Figure 5M:
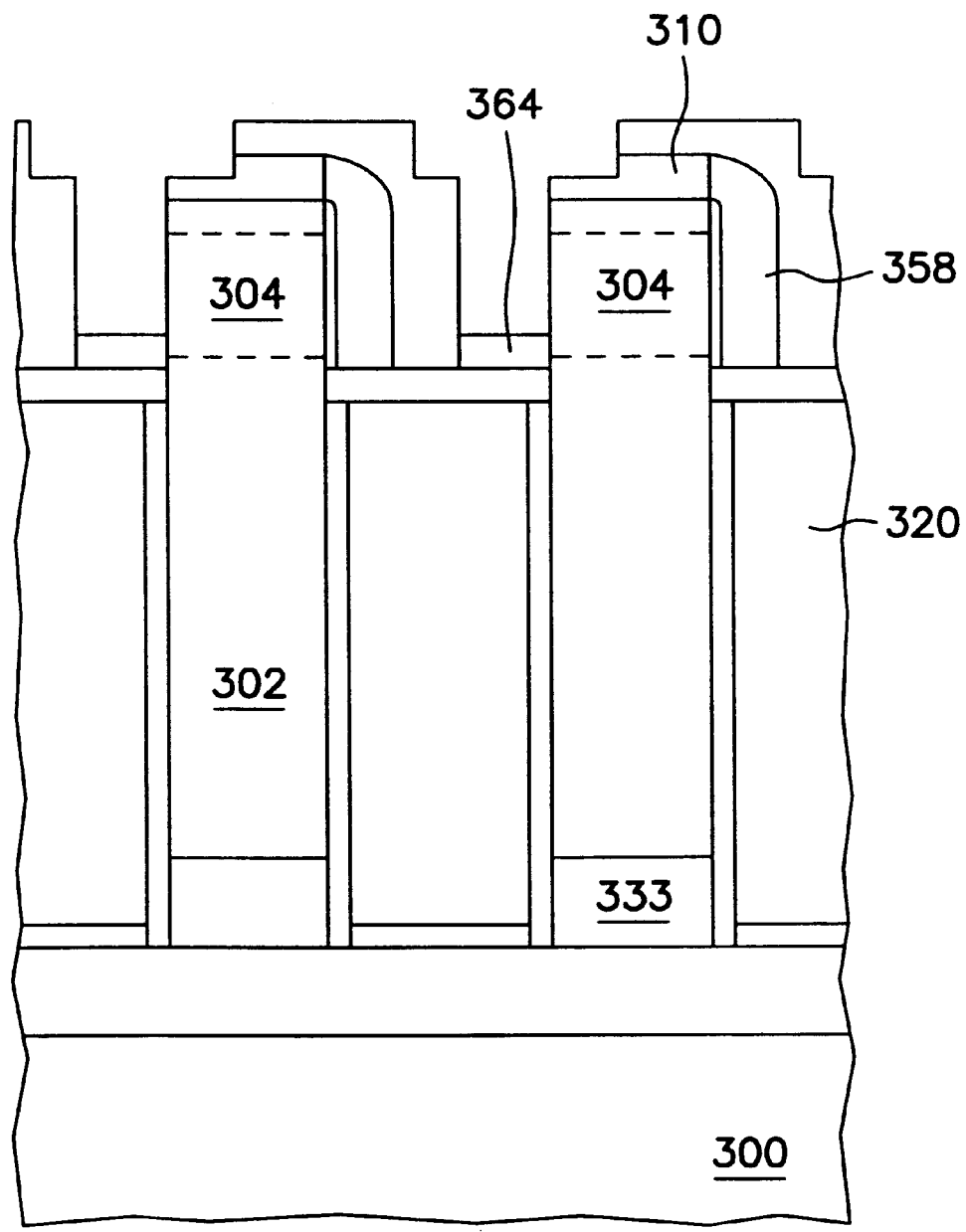

Nitride layer 358 is directionally etched through openings 362 in photoresist layer 360 to a depth sufficient to expose the top of poly-silicon spacers 357. It is noted that a portion of layer 310 may also be removed. Poly-silicon spacers 357 are etched so as to remove the spacers. Gate oxide layer 354 is isotropically etched so as to remove the gate oxide from exposed sidewall 350 of pillars 334A through 334D. Photo resist layer 360 is removed. Oxide layer 364 is deposited, by for example, chemical vapor deposition to fill the space vacated by spacers 357. Oxide layer 364 is planarized using, for example, a chemical/mechanical polishing technique to planarize with the surface of the nitride. Oxide layer 364 is further etched to a depth sufficient to expose p− silicon in layer 304 as shown in FIG. 5M.

Figure 5N:
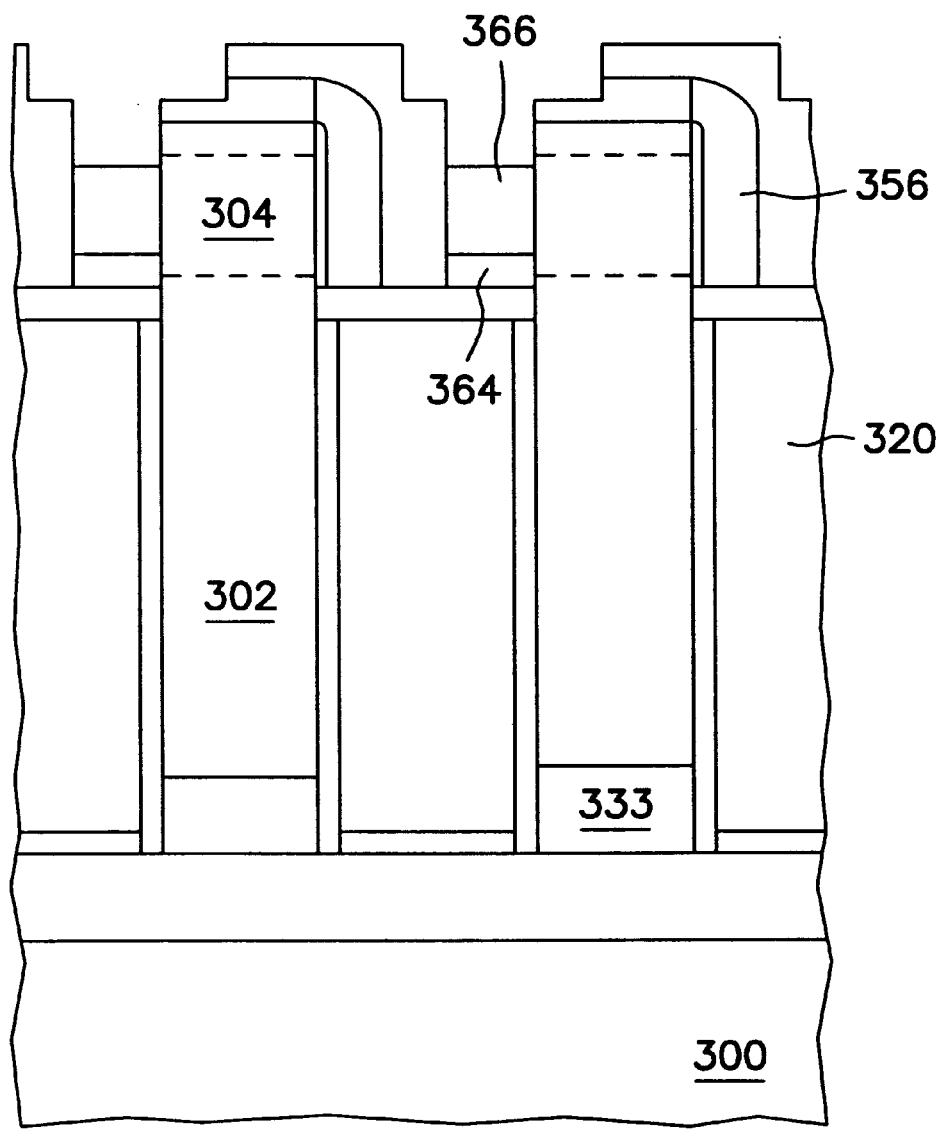
Figure 50:
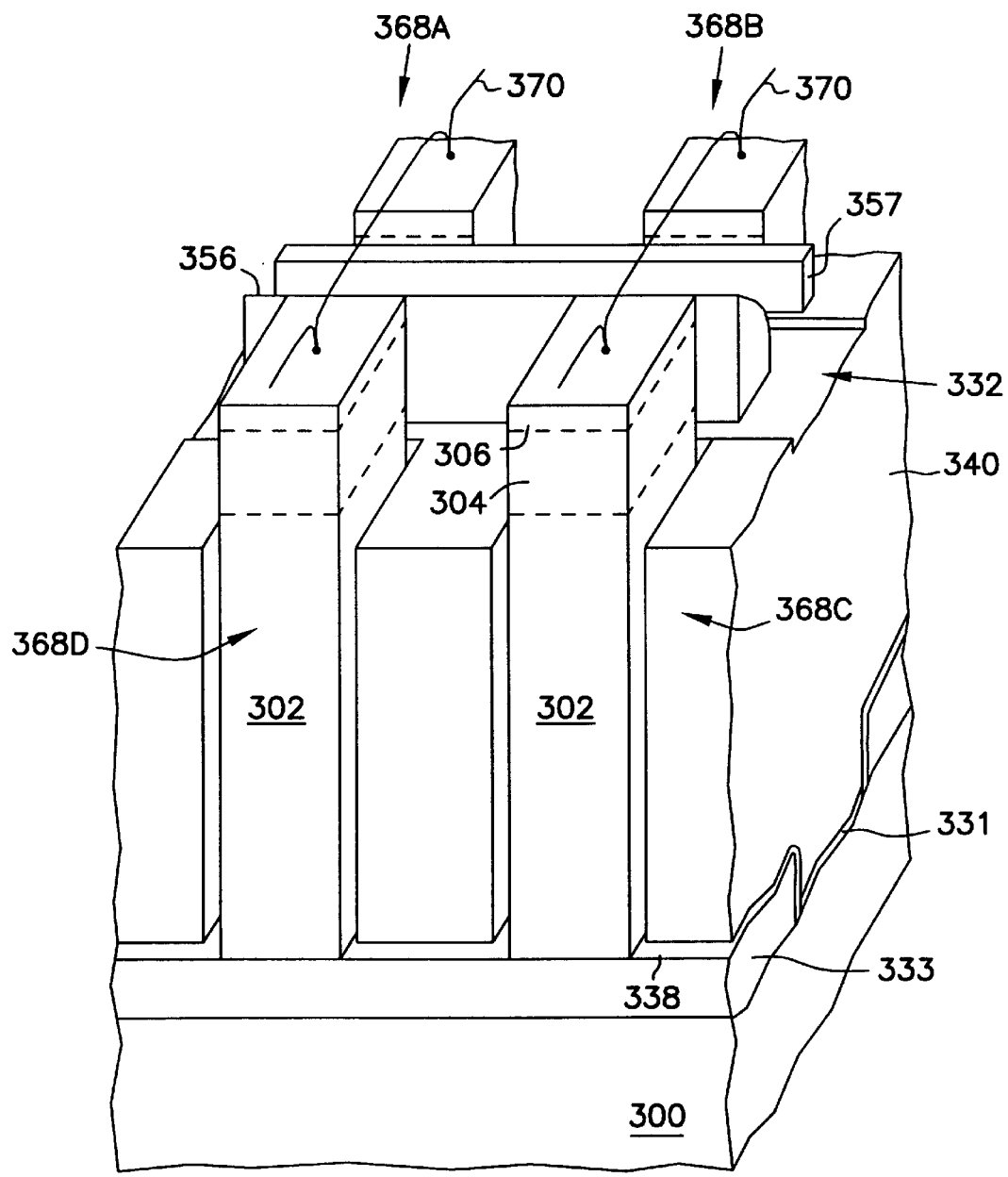

P+ poly-silicon is deposited by, for example, chemical vapor deposition to fill the space vacated by oxide layer 364. The p+ poly-silicon is planarized with the surface of the nitride. The p+ poly-silicon material is etched to below the top of layer 304 to form body contacts 366 for array 299 as shown in FIG. 5N.

Oxide is deposited to fill and is planarized to be level with a top surface of the nitride. The remaining exposed nitride is stripped with an isotropic etch. The exposed word lines 358 are etched to recess the word lines below the top surface of pillars 334A through 334C. This produces the final structure as shown in FIG. 5O with transistors 368A through 368D and bit lines 370.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the semiconductor materials specified in this application are given by way of example and not by way of limitation. Other appropriate materials can be substituted without departing from the spirit and scope of the invention.

What is claimed is:

1. A method of fabricating a memory array, the method comprising the steps of:

forming a number of access transistors, each access transistor formed in a pillar of semiconductor material that extends outwardly from a substrate wherein the access transistor includes a first source/drain region, a body region and a second source/drain region formed vertically thereupon;

forming a trench capacitor for each access transistor, wherein a first plate of the trench capacitor is integral with the first source/drain region of the access transistor;

forming a number of word lines that interconnect the gates of a number of access transistors to form a row of the array, the word lines disposed in a number of trenches that separate adjacent rows of access transistors;

forming a number of body address lines that interconnect body regions of access transistors along the rows of the array; and forming a number of bit lines that interconnect second source/drain regions of selected access transistors so as to form a number of columns of the array.

2. The method of claim 1, wherein the step of forming a trench capacitor further includes the step of forming a second plate that surrounds the first plate.

3. The method of claim 1, and further comprising the step of forming a contact that couples a second plate of the trench capacitor to an underlying semiconductor layer.

4. The method of claim 1, where the step of forming a trench capacitor comprises the step of forming a second plate that forms a grid pattern in a layer of semiconductor material such that the grid surrounds each of the pillars that form the access transistors.

* * * * *

UNITED STATES PATENT AND TRADEMARK OFFICE
CERTIFICATE OF CORRECTION

PATENT NO.     : 6,165,836
DATED          : December 26, 2000
INVENTOR(S)    : Forbes et al.

It is certified that error appears in the above-identified patent and that said Letters Patent is hereby corrected as shown below:

Column 1,
Line 13, insert a period after "capacitor".

Column 4,
Line 45, delete "in;" and insert -- in --, therefor.

Signed and Sealed this

Third Day of February, 2004

JON W. DUDAS
*Acting Director of the United States Patent and Trademark Office*